(12) United States Patent  
Kosugi et al.

(10) Patent No.: US 6,870,744 B2  
(45) Date of Patent: Mar. 22, 2005

(54) CLAMPING MECHANISM FOR CLAMPING CARD-SHAPED ELECTRONIC COMPONENT, AND ELECTRONIC APPARATUS HAVING THE SAME

(75) Inventors: Naofumi Kosugi, Kawasaki (JP); Masaru Irie, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/443,979

(22) Filed: May 23, 2003

(65) Prior Publication Data

US 2003/0199188 A1 Oct. 23, 2003

Related U.S. Application Data

(63) Continuation of application No. PCT/JP00/08354, filed on Nov. 27, 2000.

(51) Int. Cl.[7] .............................. H05K 7/14; H05K 7/18
(52) U.S. Cl. ...................... 361/801; 361/684; 361/685; 361/683; 211/41.17
(58) Field of Search ................................. 361/801, 825, 361/683–685, 707, 747, 756; 211/41.17; 439/327

(56) References Cited

U.S. PATENT DOCUMENTS

| 5,822,193 A | * | 10/1998 | Summers et al. ............ 361/759 |
| 6,017,004 A | * | 1/2000 | Grantham ................... 248/27.3 |
| 6,442,037 B1 | * | 8/2002 | Boe ............................ 361/759 |

FOREIGN PATENT DOCUMENTS

| JP | 48-11355 | 2/1973 |
| JP | 3-196598 | 8/1991 |
| JP | 4-51189 | 4/1992 |
| JP | 5-235565 | 9/1993 |

* cited by examiner

Primary Examiner—Kamand Cuneo  
Assistant Examiner—Hung S. Bui  
(74) Attorney, Agent, or Firm—Westerman, Hattori, Daniels & Adrian, LLP

(57) ABSTRACT

A clamping mechanism includes a retention part that fixes a card-shaped electronic component that has been inserted into a slot in a predetermined direction for electric connection, and a support part that supports the retention part in a direction that intersects with the predetermined direction.

14 Claims, 16 Drawing Sheets

CLAMPING MECHANISM FOR CLAMPING CARD-SHAPED ELECTRONIC COMPONENT, AND ELECTRONIC APPARATUS HAVING THE SAME

This application is a continuation based on PCT International Application No. PCT/JP00/08354, filed on Nov. 27, 2000, which is hereby incorporated by reference herein in its entirety as if fully set forth herein.

BACKGROUND OF THE INVENTION

The present invention relates to a clamping mechanism that fixes a card-shaped electronic component that has been inserted into a slot provided on a board or at another location, and an electronic apparatus having this clamping mechanism. The present invention is suitable, for example, for a clamping mechanism that fixes an expansion card that has been inserted into an expansion slot or an expansion bus slot on a motherboard in desktop personal computer ("PC"), a word processor, and other electronic apparatuses, and an electronic apparatus having such a clamping mechanism.

A motherboard is a board provided with various circuit elements, such as a memory, a chip set, an expansion slot and a BIOS ROM as well as a CPU. The expansion card is a printed board that functionally expands a PC and other electronic apparatuses singularly or by enabling them to communicate with an external peripheral or expansion unit. An expansion card is called an expansion board or PCI board, such as a SCSI card, a network card, a sound card, a video card, a memory card, and various interface cards.

Along with recent developments of information industries, PCs have wide spread among various personal and business applications. This spread has diversified users' demands to PCs, but multifunctional and small PCs have increasingly demanded. One solution for the demand for a multifunctional PC is to mount various types of expansion cards into an expansion slot on a motherboard.

The expansion card typically includes a card part that arranges various types of circuits, a first interface connector that electrically connects the card part to a motherboard, and optionally a second interface connector that connects a certain type of expansion unit to a PC. The latter example includes, for example, a SCSI card mounted on a PC, and a second interface connector of the SCSI card connected to an external unit, such as a CD-ROM (or CD-R/RW) drive, a MO drive and a scanner.

The expansion card is electrically connected to a motherboard and supported in a slot when the first interface connector is inserted into the motherboard. The PC may further include a clamping mechanism that presses and clamps the expansion card from a surface opposite to the first interface and strengthens the fixture of the expansion card, preventing pullout and contact inhibition of the card.

The conventional clamping mechanism, however, structurally forms dead space that is not used always inside the electronic apparatus, inhibiting its miniaturization. A description will now be given of a conventional clamping mechanism 500 and its problems with reference to FIGS. 19 to 21. Here, FIGS. 19 and 21 are enlarged perspective views of the conventional PC near the clamping mechanism 500. FIG. 19 shows the clamping mechanism 500 that fixes a high expansion card 10a. FIG. 21 shows the clamping mechanism 500 that fixes a low expansion card 10b. FIG. 20 is an enlarged view of a fixing member 520 used for the clamping mechanism 500. Here, reference numerals without an alphabetical letter generalize reference numerals with small alphabetical letters.

Referring to FIGS. 19 and 20, the expansion card 10a is inserted into one of slots 610 provided on the motherboard 600 perpendicular to the motherboard 600. $S_1$ is an insertion direction of the expansion card 10a. $S_2$ is a direction reverse to the direction $S_1$, or a height direction of the expansion card 10a. T is a length direction of the expansion card 10 perpendicular to the directions $S_1$ and $S_2$, which are generically referred to as a direction S. The motherboard 600 is fixed onto a PC frame 702.

One end of the clamping mechanism 500 is fixed onto a PC frame 704, and its other end is fixed onto a support strip that is fixed onto a frame 706. The clamping mechanism 500 includes a support member 510 that supports one or more fixing members 520, and one or more fixing members 520 each of which presses and secures the expansion card 10a. The support member 510 is arranged above the expansion card 10 in the PC so that its longitudinal direction is orthogonal to the length direction T of the mounted expansion card 10. Each fixing member 520 is screwed onto the support member 510.

Referring now to FIG. 20, each fixing member 520 has a bent, approximately L-shape, and includes a height adjustment part 522 having a fixing groove 523, and a pressure part 524 that presses the expansion card 10. The fixing member 520 is fixed onto the support member 510 by inserting a screw (not shown in FIG. 20) into the fixing groove 523 and a certain screw hole in the support member 510. In use, the screw is unfastened and the fixing member 520 moves in the direction S under guide by in the fixing groove 523 in the height adjustment part 522 until the pressure part 524 contacts the edge 12 of the expansion card 10a. Then, the height adjustment part 522 is screwed so that the pressure part 524 contacts the edge 12 of the expansion card 10a in the insertion direction $S_1$ with a predetermined compression force.

While another method for clamping an expansion card has been also known which previously provides an attachment plate to an end of an expansion card and fixes it onto a PC frame through plural screws, the above clamping mechanism 500 has an advantage in that it more easily fixes the expansion card 10 than the conventional method since the expansion card 10 may be fixed by adjusting and determining a position of the fixing member 520 through one screw.

Although the fixing member 500 may clamp the expansion cards 10 of different heights within a length of the height adjustment part 522, the clamping mechanism 500 is required to use a higher height adjustment part 522b than the height adjustment part 522, as shown in FIG. 21, along with diversified functions, shapes and heights of recent expansion cards 10. However, it is arduous to use the height adjustment parts 522 of different lengths according to types of the expansion unit 10. In addition, the clamping mechanism 500 should be compatible with any type of expansion card since a user later often attaches the expansion card. On the other hand, when all the height adjustment parts 522 are replaced with the height adjustment parts 522b, the PC comes to form the dead space, which enlarges the PC contrary to a demand of miniaturization.

Moreover, some expansion card 10 has a connector and part of circuit pattern near its edge 12 at a position to be fixed by the fixing member 520 and requires, in this case, a contact position of the fixing member 520 to move in the direction T of the expansion card 10. It is arduous to increase the number of support members 510 separately for this purposes.

BRIEF SUMMARY OF THE INVENTION

Accordingly, it is an exemplified general object of the present invention to provide a novel and useful clamping mechanism and an electronic apparatus having the same in which the above disadvantages are eliminated.

A more specific but exemplary object of the present invention is to provide a clamping mechanism that may effectively provide a small electronic apparatus, and an electronic apparatus having the same.

In order to achieve the above objects, a clamping mechanism of one aspect according to the present invention includes a retention part that fixes a card-shaped electronic component that has been inserted into a slot in a predetermined direction for electric connection, and a support part that supports the retention part in a direction that intersects with the predetermined direction. This clamping mechanism may move the retention part in two directions which intersect with the support part, and fix the card-shaped electronic component at two points when moving it in one of the directions. The retention part may be move by 180 degrees around the support part when viewed from the insertion direction. For example, even when the retention part is required to fix the card-shaped electronic component at only one of the above two positions, when the retention part is rotated by 180 degrees, it may fix the electronic component at two points. The retention part includes, for example, a slit. This structure allows the retention part to be fixed onto and move relative to the support part when the retention part is connected to the support part through a screw or rivet etc.

A clamping mechanism of another aspect according to the present invention includes an approximately U-shaped retention part that fixes a card-shaped electronic component that has been inserted into a slot for electric connection, and a support part that supports the retention part. This clamping mechanism may move the retention part along the approximately U shape on the support part as a vertex, and prevent the retention part from projecting in the direction opposite to the insertion direction of the card-shaped electronic component. The retention part may vary a shape and radius of curvature of the U shape, and becomes compatible with card-shaped electronic components of various shapes.

A clamping mechanism of another aspect according to the present invention includes a retention part that fixes a card-shaped electronic component that has been inserted into a slot in a predetermined direction for electric connection, a support part that rotatably supports the retention part, and a forcing mechanism that enables the retention part to apply a force to the electronic component in the predetermined direction. This clamping mechanism uses the forcing mechanism to press and fix the card-shaped electronic component in the insertion direction, and may press the card-shaped electronic components of various heights by rotating the retention part.

An electronic apparatus of still another aspect of the present invention includes a card-shaped electronic component, a board that arranges at least a slot, the electronic component being connectible electrically to the board when inserted into the slot in a predetermined direction, and the above clamping mechanism for clamping the electronic component that has been inserted into the slot. This electronic apparatus exhibits operations similar to the above clamping mechanisms.

A retention part of another aspect of the present invention used for a clamping mechanism that clamps in a slot a card-shaped electronic component that has been inserted in a predetermined direction into the slot provided on a board that is electrically connectible to the electronic component includes a base having a curved section, and a fixing part, connected to the base, which presses and fixes the electronic component. This retention part also exhibits operations similar to the above clamping mechanisms.

Other objects and further features of the present invention will become readily apparent from the following description of the embodiments with reference to accompanying drawings.

DETAILED DESCRIPTION OF THE INVENTION

Figure 1:
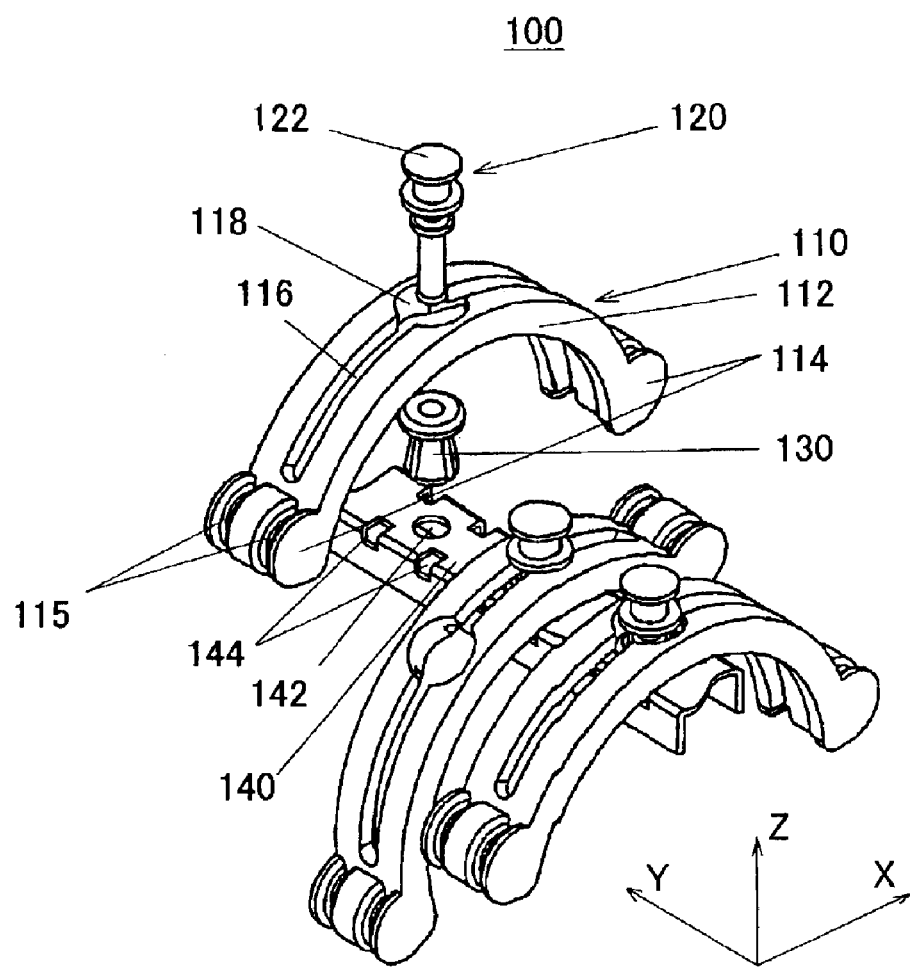
FIG. 1 is a schematic perspective view of a retention unit as one aspect according to the present invention.

Referring now to the accompanying drawings, a description will be given of a clamping mechanism 100 for fixing the expansion card 10 as one example of a card-shaped electronic component as one aspect of the present invention. The instant specification refers to this clamping mechanism 100 as a retention unit. In each figure, the same reference numeral denotes the same element and a duplicate description will be omitted. The same reference numeral with a capital generally denotes a variation, and a reference numeral without an alphabetical letter generalizes all the reference numerals with alphabetical letters.

Figure 2:
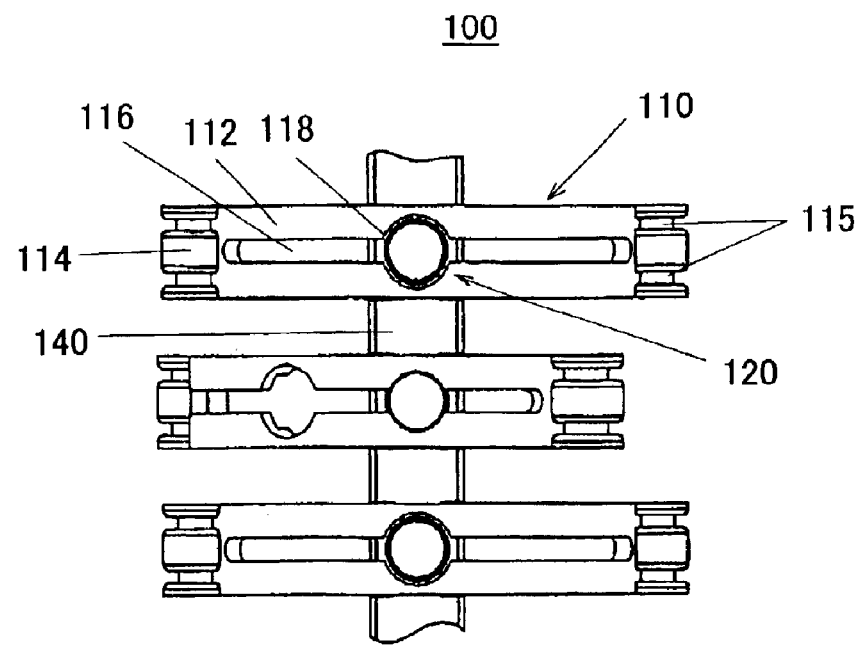
FIG. 2 is a plane view of the retention unit shown in FIG. 1 viewed in a direction opposite to a direction Z.
Figure 3:
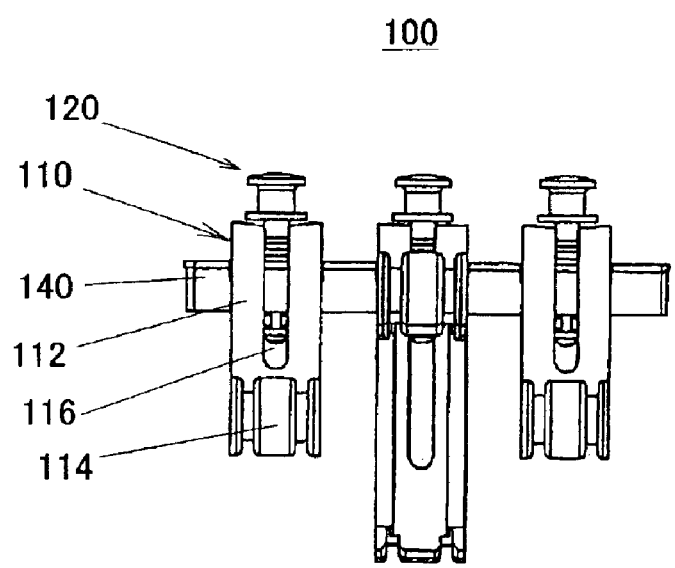
FIG. 3 is a side view of the retention unit shown in FIG. 1 viewed in a direction X.
Figure 4:
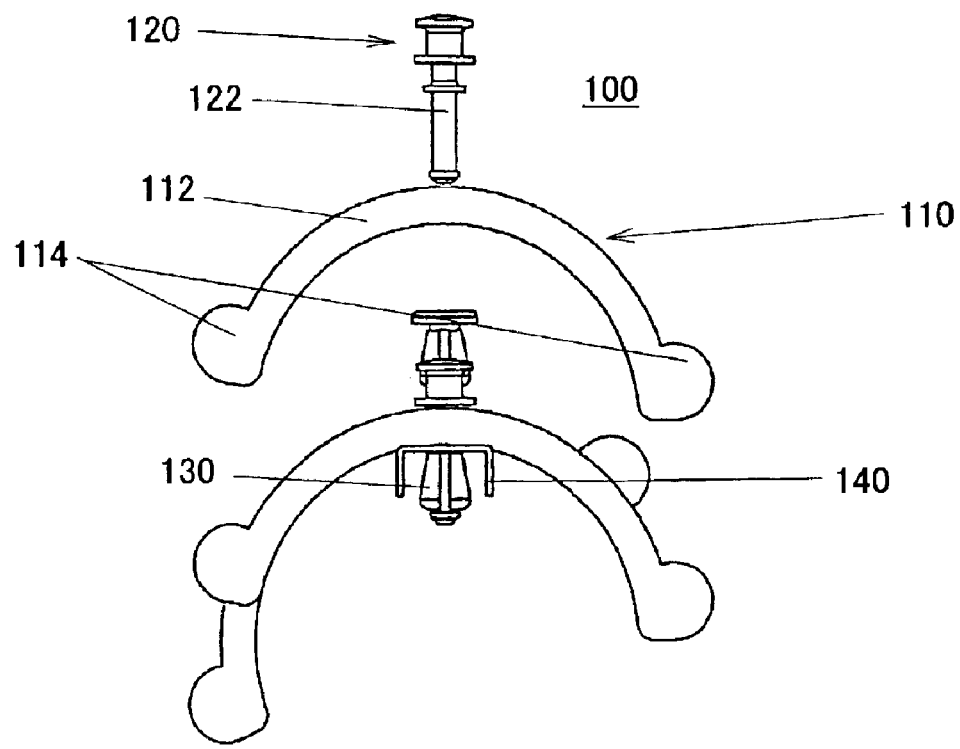
FIG. 4 is a side view of the retention unit shown in FIG. 1 viewed in a direction Y.

Referring to FIGS. 1 to 4, the retention unit 100 includes a retention part 110, a rivet part 120, and a bridge part 140. Here, FIG. 1 is a schematic perspective view of a retention unit 100 as one aspect of the present invention. FIG. 2 is a plane view of the retention unit 100 when it is viewed in a direction opposite to a direction Z. FIG. 3 is a side view of the retention unit 100 when it is viewed in a direction X. FIG. 4 is a side view of the retention unit 100 when it is viewed in a direction Y. The retention unit 100 of the instant embodiment arranges plural retention parts 110 above a top surface 141 of one bridge part 140 through a corresponding number of rivet parts 120, orthogonal to the bridge part 140 as shown in FIG. 2, and fixes these retention parts 110 with a predetermined orientation on the bridge part 140 as shown in FIG. 4. Each retention part 110 has a predetermined width in the direction Y shown in FIG. 1 and an arc- or U-shape as shown in FIG. 4 when viewed in the direction Y shown in FIG. 1. The bridge part 140 has a U-shaped section when severed along a plane parallel to an X–Z plane shown in FIG. 1, and straightforwardly extends in the direction Y in FIG. 1. The number of retention parts 110 corresponds to the number of expansion slots 410 provided on a motherboard 400 (not shown).

The retention part 110 is engaged with an edge 12 of the expansion card 10 (not shown in FIGS. 1–4), and presses and fixes the expansion card 10 that is loaded onto the (expansion) slot 410. The retention part 110 is made, for example, of plastic molding, preferably an insulator material to prevent the motherboard 400 from short-circuiting because the retention part 110 is configured detachably, and possibly falls down on the motherboard 400 below it when it is being attached and detached. In addition, if it is made of metal, rust and patina powder would fall down on the motherboard 400.

Figure 5:
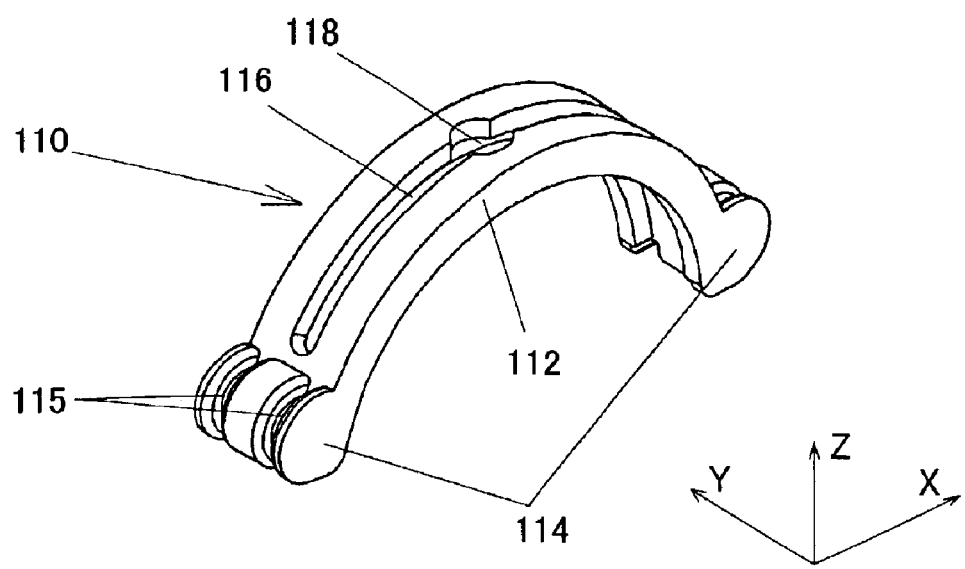
FIG. 5 is a perspective view of a retention part in the retention unit shown in FIG. 1.
Figure 6:
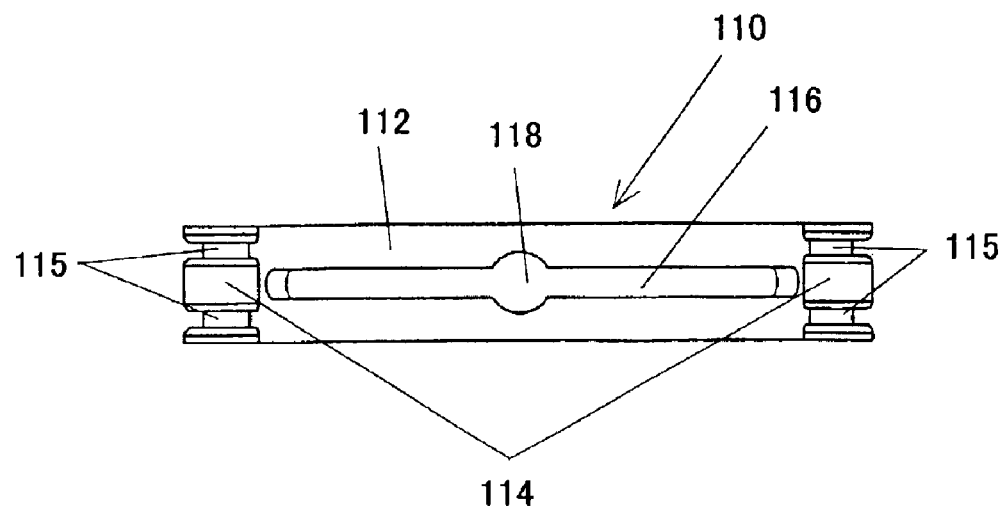
FIG. 6 is a top view of the retention part shown in FIG. 5.
Figure 7:
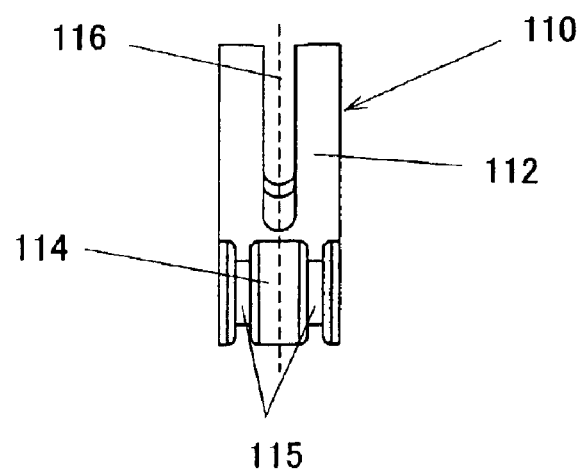
FIG. 7 is a longitudinal side view of the retention part shown in FIG. 5.
Figure 8:
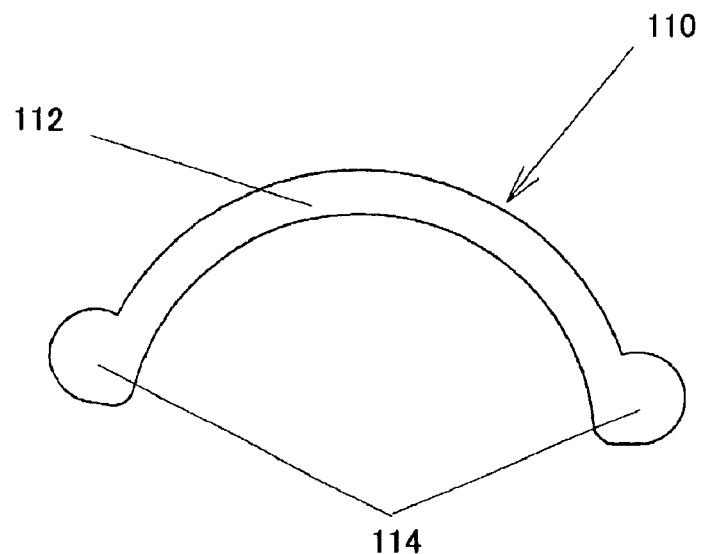
FIG. 8 is a lateral side view of the retention part shown in FIG. 5.

As best shown in FIGS. 5–8, the retention part 110 exemplarily includes an arm part 112, a pair of card fixing parts 114 and a slit 116. The card fixing parts 114 are provided at both ends of the arm part 112, and the slit 116 is provided at the center of the arm part 112. Here, FIG. 5 is a perspective view of the retention part 110 in the retention unit 100. FIG. 6 is a top view of the retention part 110. FIG. 7 is a longitudinal side view of the retention part 110. FIG. 8 is a lateral side view of the retention part 110.

The arm part 112 has an arc- or U-shape when it is viewed in the direction Y in FIG. 1, and is formed as a plate member having a sufficient width in the direction Y in FIG. 1 to form the slit 116. As described later, a provision of the slit 116 is optional, and thus the arm part 112 may become narrow in that case. Therefore, the width of the arm part 112 shown in FIG. 1 is for exemplary purposes.

The arm part 112 in this embodiment supports a pair of card fixing parts 114, is so elastic that it may press the expansion card 10 through one of the card fixing parts 114. Alternatively, another embodiment uses a spring or another member to provide a compression force, and forms the arm part 112 as an elastic or rigid member, as described later. The arm part 112 may be configured as a rigid member when the expansion card 10 uses an elastic member, such as rubber, for the edge 12.

The instant embodiment connects the arm part 112 to the rivet 120 at its center, and the retention part 110 is fixed onto the bridge 140 through the arm part 112. Alternatively, another embodiment that will be described later enables the retention part 110 to be fixed onto the bridge 140 through an edge of the arm part 112 or another member connected to the arm 112.

The arm part 112 is fixed onto the bridge part 140 so that an opening of the arc faces downwardly or the expansion card 10 side in a direction opposite to the direction Z or in a state of upward convex. The arm part 112 shown in FIG. 1 has a thickness enough to maintain the above elastic force. Of course, the necessary thickness of the arm part 112 for a necessary elastic force depends upon materials to be used.

Figure 28:
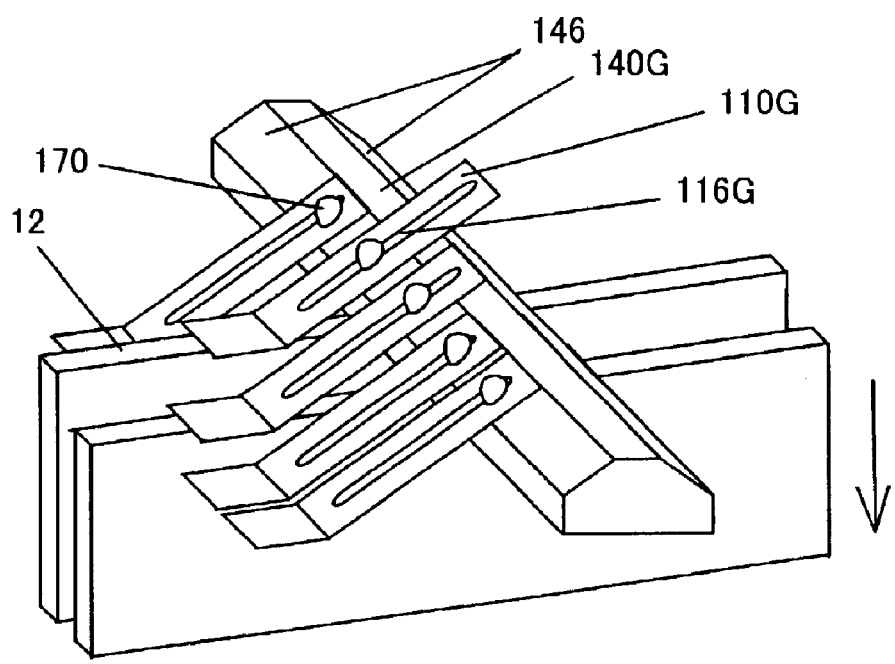
FIG. 28 is a schematic side view of a retention unit as another aspect according to the present invention.

The retention part 110 may become compatible with expansion cards 10 with various shapes, by changing a shape and radius of curvature of the arm part 112. When the retention part 110 fixes the expansion card 10, the arm 112 always generates the stress. The instant embodiment exemplarily provides the arm part 112 with an arc shape, but the present invention does not require the arm part 112 to have a perfect arc section with a certain radius of curvature. Rather, the arm part 112 may have a curved shape, a U shape, a V shape, a polygonal shape, etc. when it is viewed in the direction Y in FIG. 1. Advantageously, the arm part 112 that has an upward convex section shape would enable the retention part 110 to fix the expansion card 10 at two points, as described later. Another aspect of the present invention has an effect in that the retention part 110 does not require a larger dead space than the conventional in the direction Z in FIG. 1 or the fixing member 520 that moves perpendicularly in the direction S. From the latter effect, the arm part 112 does not necessarily have an upward convex section shape as in the other embodiment, and may have, for example, a linear shape as shown in FIG. 28 which will be described later.

Each card fixing part 114 is provided at both ends of arc-shaped arm part 112, and has an approximately semi-circular section as shown in FIG. 8. Such a shape of the card fixing part 114 realizes a smooth engagement between the expansion card 10 and the card fixing part 114 even when the card fixing part 114 inclines relative to the expansion card 10. Therefore, if necessary, the card fixing part 114 may have a shape of perfect circle or approximately circle. As described later, the number of card fixing parts 114 may be provided only one for each arm part 112.

Each card fixing part 114 has a pair of grooves or concave parts 115 as shown in FIGS. 5 to 7 in the instant embodiment, and one of the concave parts 115 is engaged with the edge 12 of the expansion card 10 and presses and fixes the expansion card 10 in the slot 410. The card fixing part 114 of the instant embodiment has a pair of concave parts 115 for molding convenience, but only one concave part 115 may be provided at the center. For a definite engagement between the expansion card 10 and the concave part 115, and for a protection of the edge 12 of the expansion card 10, the concave part 115 of the card fixing part 114 is preferably made of or coated by an elastic material, such as rubber.

While the instant embodiment has a pair of card fixing parts 114, a pair of concave parts 115 are effective when they are provided laterally symmetrically with respect to a dotted line in FIG. 7, especially when the arm part 112 that has only one card fixing part 114. This is because this case rotates the retention part 110 by 180 degrees around the rivet part 120 shown in FIG. 1 and holds the expansion unit 10 by the right concave part 115 shown in FIG. 7 before the rotation and by the left concave part 115 after the rotation shown in FIG. 7.

Only one slit 116 is provided along the longitudinal direction of the arm part 112. However, this structure is illustrative and two slits may be provided in the longitudinal direction of the arm part 112 or may have an arbitrary length. The slit 116 is engageable with a midsection 126 in the rivet part 120, which will be described later, and dimensioned so that the arm part 112 may move relative to and be fixed onto the bridge part 114. More specifically, it is made larger than the diameter of the midsection 126 of the rivet part 120, which will be described later, and smaller than a diameter of a first washer 125. Alternatively, any mechanism may be used instead of the slit 116, which may move and fix the arm part 112 as in an embodiment, which will be described later.

Circumferential stress applied to the arm 112 would move the slit 116 relative to the rivet 120. As a result, the retention part 110 may move or rotate relative to and around the bridge part 140, and has an arbitrary orientation relative to the bridge part 140, as shown in FIG. 4. Since the slit 116 is formed along its longitudinal direction approximately throughout the arm part 112, a rotatable range of the retention part 110 is relatively wide by about ±60 degrees from a state where the connection hole 118, which will be described later, is aligned with the rivet part 120 or the rightmost state in FIG. 1. Therefore, the retention unit 100 may fix expansion units 10 of various heights, as described later.

The slit 116 has such a width that it may be engaged with the midsection 126 in the rivet part 120, and fix the retention part 110 with a predetermined orientation onto the bridge part 140, as shown in FIG. 4. When the circumferential stress is applied to the arm part 112, the rivet part 120 may move in and relative to the slit 116. When radial stress is applied to the arm part 112, the rivet part 120 prevents the arm part 112 from moving and fixes the arm part 112 there. Therefore, as shown in FIG. 4, when the retention part 110 fixes the expansion card 10 with a desired orientation onto the bridge part 140, the orientation is maintained.

The slit 116 is connected to a connection hole 118 that is provided at the center of the arm part 112. The connection hole 118 has such a size that the retention part 110 is detachably attached to the bridge part 140 while the rivet 120 is connected to the bridge part 140. The connection hole 118 is larger than the head 123 of the rivet part 120, which will be described later, and the first washer 125. It is optional to provide the connection hole 118. Understandably, without the connection hole 118, the retention part 110 cannot be detached from the bridge part 140 unless the rivet part 120 is detached from the bridge part 140.

The instant embodiment arranges a pair of card fixing parts 114 of the retention part 110 at the same position apart from the expansion card 10 when the rivet part 120 is located at the connection hole 118. In other words, the retention part 110 is symmetric with respect to the connection hole 118.

The retention part 110 is designed so that a pair of card fixing parts 114 do not contact the expansion card 10 when the connection hole 118 is located at the rivet part 120.

Figure 22:
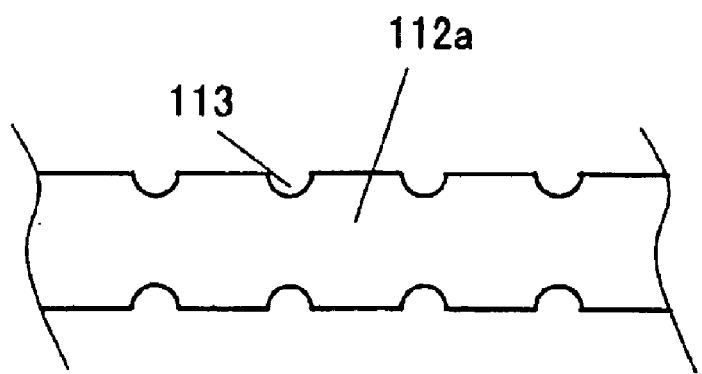
FIG. 22 is a top view of an arm part as a variation of an arm of a retention part.
Figure 23:
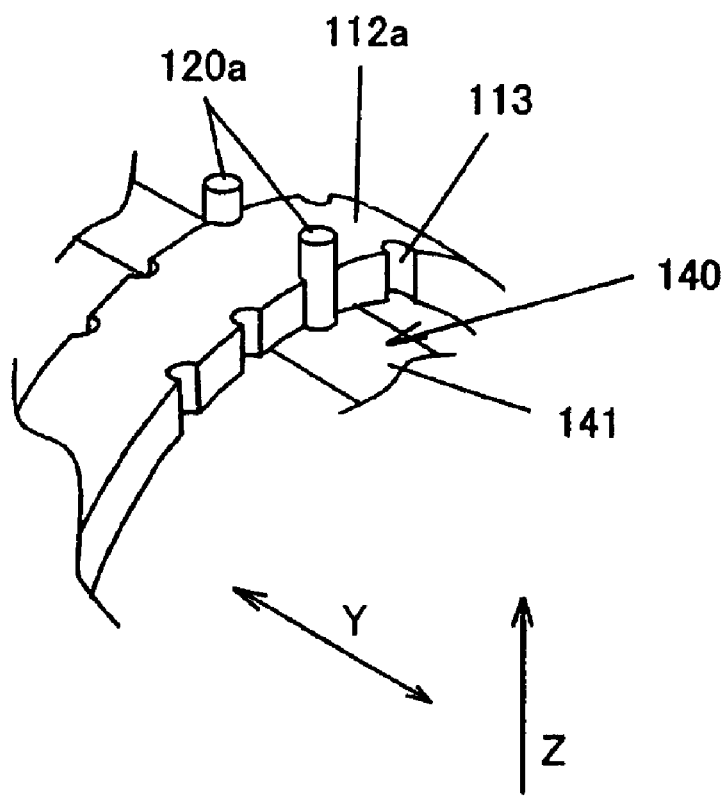
FIG. 23 is a partial perspective view of a retention unit for explaining an engagement between an arm part and a pin shown in FIG. 22.

As described above, it is optional to provide the slit 116. For example, the slit 116 and the rivet 120 may be omitted, as shown in FIGS. 22 and 23 which provide plural pairs of notches 113 symmetrically at both side surfaces of the arm 112a, and form a pair of pins 120a having a shape corresponding to the notch 113 on the top surface 141 of the bridge 140. Here, FIG. 22 is a top view of the arm part 112a as a variation of the arm 112 in the retention part 110. FIG. 23 is a partial perspective view of the retention unit for explaining an engagement between the arm part 112a and the pin 120a. In this embodiment, the pint 120a may be part of the bridge part 140a or a separate member. While the instant embodiment uses a semi-circular shaped notch 113 as shown in FIG. 22, an arbitrary shape may be provided including part of an ellipse, a polygon, a V shape, a U shape, etc. Similarly, the instant embodiment uses a cylindrical pin 120a, but an arbitrary shape may be used according to shapes of the notch 113, and the pin 120a may be a rivet and another member. Of course, a pin or projection may be formed at both side surfaces or at an arbitrary position of the arm part 112a, and a hole may be provided in the top surface 141 of the bridge part 140 correspondingly. A proper shape adjustment of the notch 113 and pin 120a may prevent swinging of the arm part 112a in the direction Y in FIG. 23. It is understood that the arm part 112a is fixed by the pin 120a by lifting the arm part 112a in the direction Z, removing the notch 113 from the pin 120a, rotating it to an arbitrary position, and inserting the notch 113 into the pin 120a.

Figure 24:
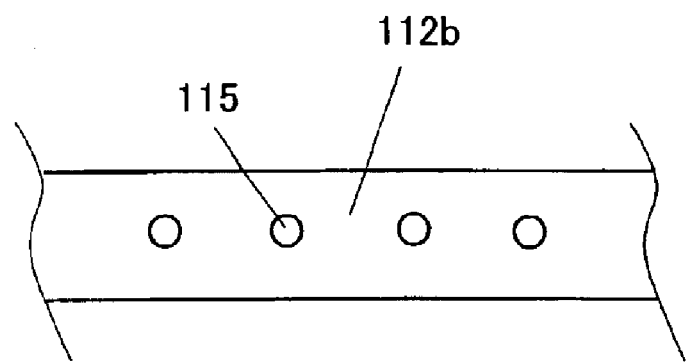
FIG. 24 is a top view of an arm part as a variation of an arm of a retention part.

As shown in FIG. 24, an arm part 112b having, at its center, plural connection holes 115 that are aligned with a longitudinal direction may be used instead of the arm part 112 that has the slit 116. Here, FIG. 24 is a top view of the arm part 112b as a variation of the arm 112 in the retention part 110. In this case, the bridge part is provided with one pin, rivet, etc. corresponding to a shape of the connection hole 115.

The instant embodiment detachably provides the rivet part 120, which serves to connect the retention part 110 to and fixed the same onto the bridge part 140. Of course, it is optional that the rivet part 120 is detachably attached to the bridge part 140, and another embodiment provides the rivet part 120 non-detachably. It is optional that the rivet part 120 is a separate member from the retention part 110 and bridge pat 140, and another embodiment uses the rivet part 120 to fix the retention part 110 and the bridge part 140 and integrates the rivet part 120 with either or both of the retention part 110 and the bridge part 140.

Figure 25:
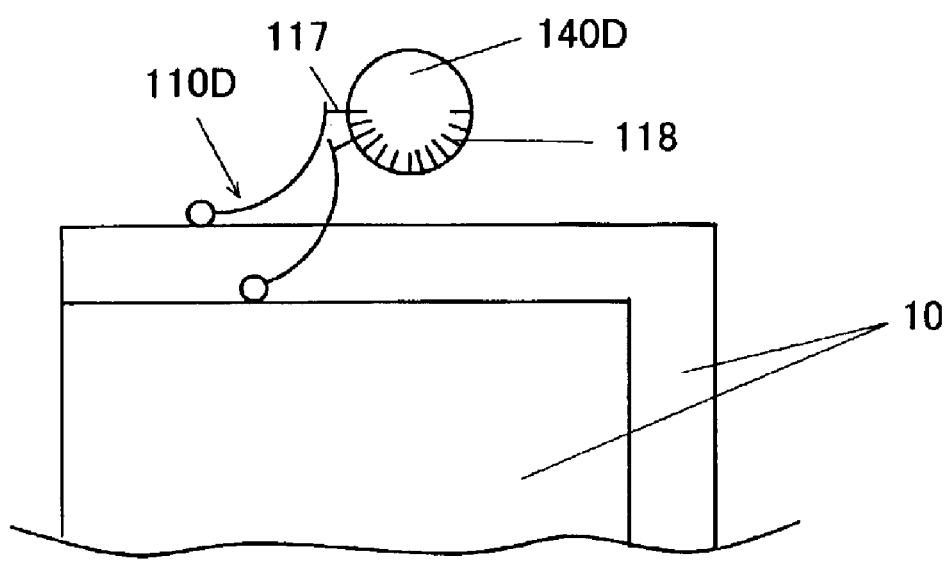
FIG. 25 is a schematic side view of a retention unit as another aspect according to the present invention.

For example, as shown in FIG. 25, a retention part 110D may be inclined relative to a bridge part 140D by providing the retention part 110D with a projection or pin 117, bridge part 140D with a groove 118 into which the projection or pin 117 may be inserted, and shaping the section of the bridge part 140D like a circle. Here, FIG. 25 is a schematic side view of the retention unit 100D of another aspect of the present invention. The retention part 110D may have a linear shape when it serves as a flat spring, and an elastic force of the flat spring may apply a compression force to the expansion card 10.

The rivet part 120 is fixed onto the bridge part 140 non-detachably, and the retention part 110 is fixed onto the bridge part 140. The rivet part 120 enables the retention part 110 to move or rotate relative to the slit 116. Although the rivet part 120 is formed detachably in the instant embodiment, it may be formed non-detachable from the retention part 110 or bridge part 140. This structure is optional. The rivet part 120 is, for example, a nylon rivet made of nylon materials, but it is preferably made of an insulator. The retention part 110 is made, for example, of plastic molding, preferably an insulator material to prevent the motherboard 400 from short-circuiting because the retention part 110 is configured detachably, and possibly falls down on the motherboard 400 below it when it is being attached and detached. In addition, if it is made of metal, rust and patina powder would fall down on the motherboard 400.

Figure 9:
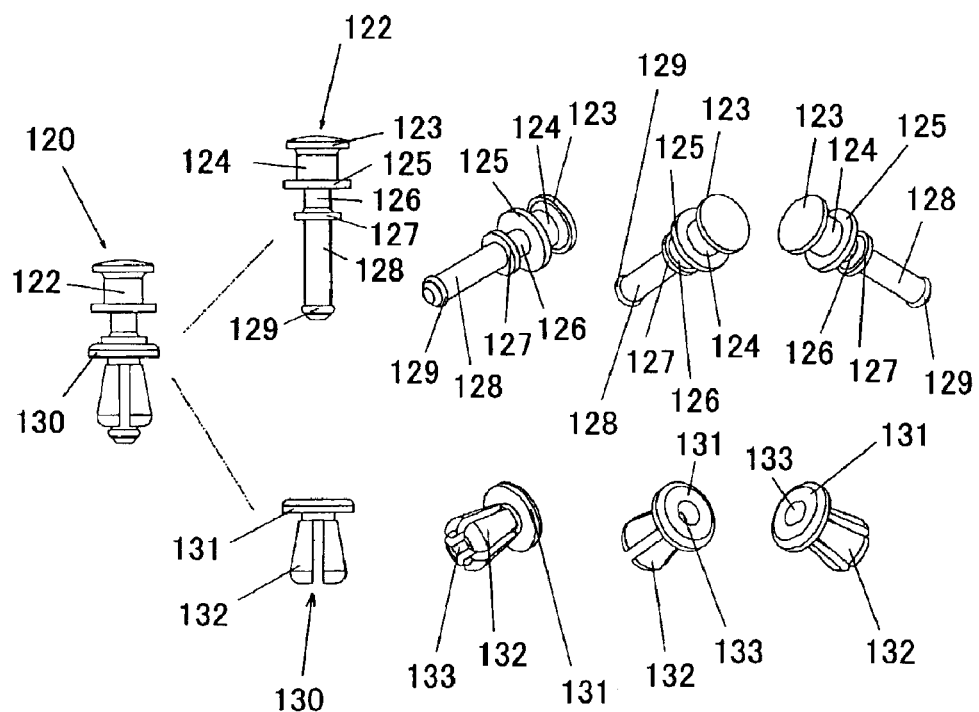
FIG. 9 is a schematic view of a rivet part in the retention unit shown in FIG. 1.
Figure 10:
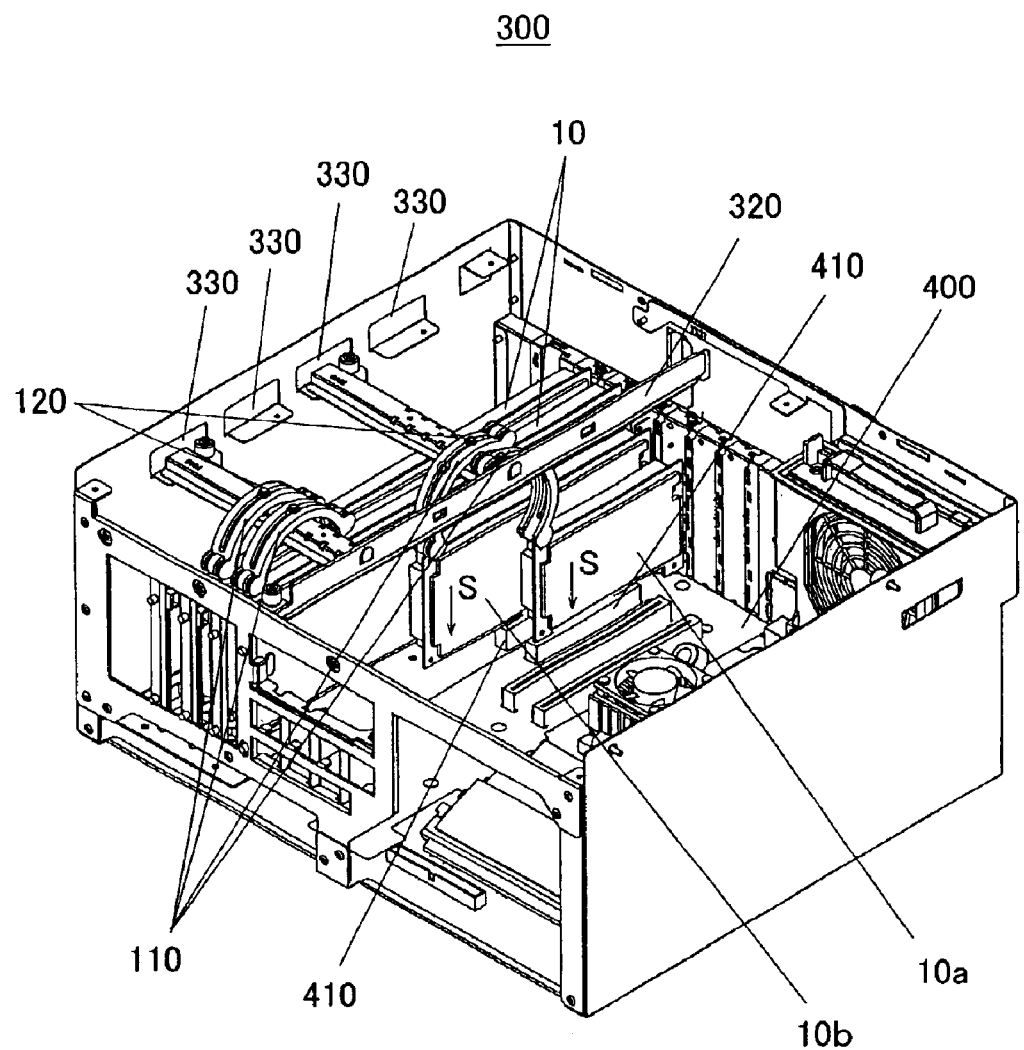
FIG. 10 is a perspective view inside a PC having the retention unit shown in FIG. 1.

Referring to FIG. 9, the rivet part 120 of the instant embodiment includes a rivet 122 and a stop 130. The rivet 122 and stop 130 typically have a shaft-bearing relationship engageable with each other. The rivet 122 is detachable from the stop 130 in this embodiment, but the rivet 122 may be integrated into the stop 130, as described later.

The rivet 122 is a rod-shaped shaft including a head 123 at the top of the shaft, and a first washer 125, a second washer 127, and a rivet convex part 129 in place which are wider than a shaft diameter. For description convenience, an upper section 124 refers to a shaft body between the head 123 and the first washer 125, a midsection refers to one between the first washer 125 and the second washer 127, and a lower section refers to one between the second washer 127 and the convex part 129. The rivet 122 is inserted into the stop 130 and fixed onto the bridge part 140 in this state, while holding the retention part 110 to be attached.

The head 123 is part corresponding to a head of a common rivet, screw, etc., and wider than the shaft diameter. The first washer 125 formed from the head 123 through the upper section 124 is a disc having a diameter larger than an aperture of the slit 116 in the above retention part 110. The head 123 and the first washer 125 should have a size to which the retention part 110 is attachable. More specifically, a diameter of each of the head 123 and the first washer 125 is made smaller than the connection hole 118. While a shaft diameter of the upper section 124 is slightly larger than those of the midsection 126 and lower section 122 in this embodiment, a shaft diameter of the upper section 124 is not limited to this embodiment and may have the same shaft diameter as those of the midsection 126 and lower section 122. This structure facilitates user's handling since the upper section 124 to be nipped by the user has a certain thickness when he/she inserts the rivet 122 into the stop 130. The upper section 124 does not have a limitation in a length in an axial direction, and is preferably designed taking user's easier handling into consideration. On the other hand, the extremely short length of the upper section 124 in the axial direction would enlarge the rivet part 120 and thus the apparatus that houses it. Therefore, the length of the upper section 124 in the axial direction preferably is kept indispensable.

The second washer 127 that is formed from the first washer 125 through the midsection 126 has a diameter larger than the shaft hole 133 of the stop 130, as described later. The rivet convex part 129 is formed as part that projects on the shaft at the end opposite to the head 123 of the rivet 122. The midsection 126 as part of the shaft has a size engageable with the slit 116, and has a diameter smaller than a width of the slit 116 of the midsection 126. The midsection 126 in the axial direction is slightly larger than the width of the retention part 110 in the direction Z. The lower section 128 has a size that may be inserted into the shaft hole 133, and more specifically has a diameter smaller than the shaft hole 133. The axial length of the lower section 128 is the same as or slightly longer than the stop 130, which will be described later.

In the above structure, the midsection 126 in the rivet 122 is engaged with the slit 116 in the retention part 110. When the slit 116 is engaged with the midsection 126 in the rivet 122, as shown in FIGS. 1 to 3, the first washer 125 guides a circumferential movement or rotation of the retention part 110. In other words, in the rotation, the retention part 110 is prevented from moving in the direction Z. Even when a radial force applies to the retention part 110, the retention part 110 is prevented from lifting from the bridge part 140 only when the rivet 122 is fixed. In such an action, the first washer 125 frictionally contacts the retention part 110, the retention part 110 may be fixed relative to the bridge part 140 and the rivet part 120 using this friction force. A clamping method of the rivet 122 onto the bridge part 140 will be discussed later. The second washer 127 serves as a stopper that restricts further insertion of the rivet 122 that has been inserted into the stop 130.

Each part of the rivet 122 has a circular section shape in this embodiment, but may have another shape. As in a variation, which will be described later, part or all of the sectional shape is a polygon etc. Similarly, a shape of each of the head 123, the first and second washers 125 and 127 is not limited to the disc. It is sufficient that these parts have the above predetermined area to achieve their functions.

The stop 130 has an approximately T sectional shape, and includes a seat 131 and an engagement part 132. The stop 130 has, at its center, a shaft hole 133 into which the rivet 122 is inserted. Here, a center shaft of the shaft hole 133 is defined as a center shaft of the stop 130. The stop 130 has approximately the same length as that of the lower section 128 so that it may be inserted into the lower section 128 in the rivet 122. The stop 130 is attached to and fixed onto an attachment hole 142 in the bridge part 140, and allows the rivet 122 to be inserted into the shaft hole 133 in this state.

The seat 131 is a disc larger than the attachment hole 14 of the bridge part 140, which will be described later. The seat 131 prevents the stop 130 from dropping off from the attachment hole 142. In other words, a shape and size of the seat 131 are not limited as long as the stop 130 does not drop out of the attachment hole 142. The engagement part 132 concentrically extends like a skirt and is smaller than the seat 131 even at its maximum outer diameter. The engagement part 132 has a cross cut which shrinks in the axial direction when a user forces the engagement part 132 to narrow the engagement part 132. The engagement part 132 establishes the entire shape such that it may be inserted into the attachment hole 142 in this state. For example, an outline of the engagement part 132 is preferably parallel in the folded state. Advantageously, this shape is easily inserted into the attachment hole 142. The rivet part 120 is made of nylon materials and thus the engagement part 132 restores to the original state when the user releases it.

The shaft hole 133 is provided at the center of the stop 130, and has a diameter into which the lower section 128 and the rivet convex part 129 of the rivet 122 may be inserted. The shaft hole 133 is inserted into and integrated with the lower section 128 of the rivet 122. The instant embodiment provides an edge at the side of the engagement part 132 of the shaft hole 133 with the convex part (not shown). The convex part is engaged with the rivet convex part 129 that projects from the shaft hole 133 when the rivet 122 is inserted, and serves to prevent the rivet 122 from easily pulling off. A connection mechanism between the rivet 122 and the stop 130 is not limited to this embodiment as long as it may achieve this function.

While the rivet part 120 in this embodiment includes two members including the rivet 122 and the rivet engagement part 126, the present invention does not limit the rivet part to this structure. For example, the rivet 122 may be integrated with the rivet engagement part 126. This structure may omit the second washer 127 and rivet convex part 129 in the rivet 122. It is sufficient that the rivet part 120 serves to fix and move the retention part 110 relative to the bridge part 140.

Figure 17:
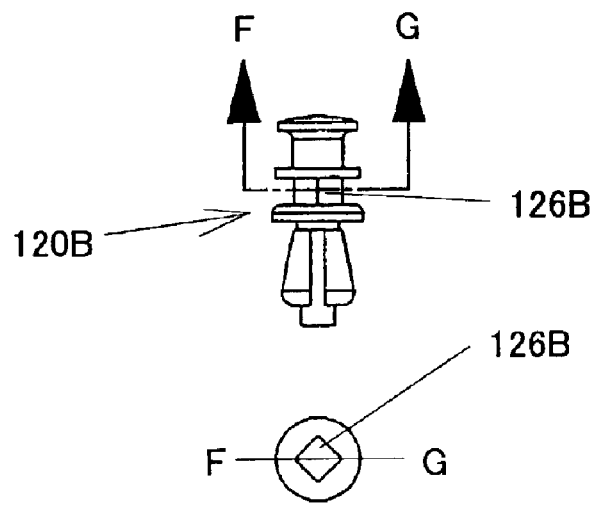
FIG. 17 is a side view of a rivet part of the retention unit shown in FIG. 16 and a sectional view of this rivet part taken along line F–G.

Referring back to FIGS. 1 to 4, the bridge part 140 is a long plate and has a U-shaped section in this embodiment such that the thin plate thickness may enhance the rigidity. The bridge part 140 has such a longitudinal length that it may arrange the retention parts 110 for expansion slots 410 (not shown). The bridge part 140 is fixed onto a PC (not shown), and supports the retention parts 110 above the expansion card 10. The instant embodiment supports the retention part 110 on its top surface 141, and this structure is optional. The bridge part 140 may support the retention parts 110 at its bottom surface (not shown). A sectional shape of the bridge part 140 is not limited to the U shape, but may use an arbitrary shape including a circle as shown in FIGS. 25 and 17 and a triangle as shown in FIG. 28. The bridge part 140 includes plural attachment holes 142, and fixing grooves 144.

The attachment hole 142 is an opening having a certain diameter, into which the folded engagement part 132 may be inserted. In other words, when the engagement part 132 is not folded in a normal state, the attachment hole 142 is smaller than the maximum outer diameter of the engagement part 132. The stop 130 may be inserted into the attachment hole 142 when its engagement part 132 is folded. After the stop 130 is inserted, the engagement part 132 restores to its original state, the stop 130 and thus the above opening may fix the stop 130. The attachment hole 142 mechanically fixes the retention part 110 onto the bridge part 140 by inserting the stop into the rivet 122 and attaches the retention part 110. A connection force between the stop 130 and attachment hole 142 is set so that the retention part 110 is not pulled off in the direction Z in FIGS. 1 to 4 when it is fixed into the expansion unit.

There is one attachment hole 142 in the instant embodiment for each expansion slot 410 (not shown) at a corresponding position in the bridge part 140. However, when the number of slits 116 in the retention part 110 and the number of rivet parts is two each, the corresponding number of attachment holes 142 is provided in the bridge part 140, of course. A shape of the attachment hole 142 may be modified according to shapes of the stop 130 of the rivet part 120.

The instant embodiment provides two fixing grooves 144 at one side at a right-angle part and totally four fixing grooves 144 at each point in the bridge part 140. The fixing groove 144 has a cutout enough for the retention part 110 attached to the rivet part 120 to be engaged with the plate member at the U-shaped opening side. The fixing grooves 144 always maintain the intersection angle between the bridge part 140 and retention part 110. Referring to FIGS. 1 and 2, the bridge part 140 in the instant embodiment intersects with the retention part 110 at a right angle, which is maintained by the bridge part 140. In other words, the fixing grooves 140 prevent the retention part 110 from rotating by 360 degrees around the rivet part 120 when viewed from the direction shown in FIG. 2 when the retention part 110 is attached to the rivet part 120. This structure prevents a force from being applied to the expansion card 10 that has been inserted into the expansion slot 410 (not shown) in a direction bending the expansion card 10 from the expansion slot 410 when the retention part 110 presses the expansion card 10 (not shown). The present invention does not limit the fixing groove 144 to the above structure. For example, the bridge part 140 is provided with a pair of projections or pins suitable for the width of the arm part 116, and the projection or pin may maintain an intersection angle between the retention part 110 and the bridge part 140. When the arm part 112 has a rectangular sectional shape, a rail that is engaged with the fixing grooves may be formed on the arm part 112.

It is optional to form the bridge part 140 as an independent member. In other words, the bridge part 140 may be part of elements in the PC, such as a frame. When the PC has a similar element to the bridge part 140, the element may serve as the bridge part 140.

Referring now to FIGS. 4 to 6, a description will be given of a PC 300 to which the inventive retention unit 100 is applicable. Here, FIG. 4 is a perspective view showing the inside of the PC 300 having the retention unit 100 shown in FIG. 1. FIG. 5 is an enlarged perspective view of the PC 300 shown in FIG. 4 near the retention unit 100. FIG. 6 is a view of the PC 300 shown in FIG. 4 near the retention unit 100 in four directions.

The PC 300 has a housing and frame 310. The frame 310 accommodates the motherboard 400, the retention unit 100, and a hard disc drive ("HDD") and a floppy disc drive ("FDD") (not shown) inside the housing. While the instant embodiment discusses the desktop type PC, the PC 300 may be a tower type. The PC 300 is connected to a display as an output part (not shown), and a keyboard and a mouse as an input part (not shown). The display, keyboard, and mouse may use any technology known in the art, and a detailed description thereof will be omitted in the instant specification.

The motherboard 400 arranges a socket (not shown) for typically loading a CPU and a memory and an expansion slot 410 to which the expansion card 10 is attached. Respective components are electrically connected to the motherboard 400 by attaching a CPU (not shown) as a controller and a memory as a main storage to the motherboard 400. The socket to which the CPU is attached means to include both a socket and a slot, and a shape of the socket is not limited. Similarly, a shape of the socket of the memory is not limited.

The expansion slot 410 is a connector to which the expansion card 10 is loaded. A user may insert the expansion card 10 into and detach it from the expansion slot 410 according to his/her purposes. Plural expansion slots 410 may be provided. A space is provided above the expansion slot 410, which may accommodate the expansion card 10. The expansion slot 410 broadly covers an ISA bus, a PCI bus, etc., and does not limit transmission/reception circuits. When the expansion card 10 is mounted onto the expansion slot 410, a device (not shown) connected to the expansion card 10 may be electrically connected to the controller in the PC 300.

The retention unit 100 is arranged at attachment parts 320 and 330 provided on the frame 310 in the PC 300. Preferably, the retention unit 100 arbitrarily selects its location from among plural attachment parts 320 and 330. The retention unit 100 is optionally attached when the expansion card 10 is attached and detached.

The retention unit 100 is positioned above the expansion slot 410 so that the bridge part 140 is orthogonal to the expansion slot 410. The bridge part 140 uses the corresponding number of retention parts 110 and rivet parts 120 for plural expansion cards 10 to be mounted. Plural bridge parts 140 may be arranged to arrange the retention units 100 at optimal positions relative to the expansion cards 10 of different lengths.

The PC 300 includes a HDD and FDD as an auxiliary storage. For example, the HDD is a device that moves an arm with a magnetic head to read information from and write information on a disc made of a magnetic material. The HDD and FDD may use any known technology in the art, and a detailed description will be omitted.

Referring back to FIGS. 1–4, 10 and 11, a description will be given of an attachment, clamping and ejection of the retention unit 100 with the expansion card 10. In attachment, the expansion card 10 is inserted into the expansion slot 410 on the motherboard 400 from the insertion direction S. Then, the bridge part 140 is fixed onto the attachment locations 320 and 330 on the PC so that the retention part 110 is rotatable above the edge 12 of the expansion card 10. The stop 130 is inserted into the attachment hole 142 of the bridge part 140 corresponding to the expansion card 10. A user then forces and squeezes the engagement part 132 of the stop 130. Thereby, the deformable engagement part 132 is compressed and becomes insertable into the attachment hole 142. Then, it is inserted into the attachment hole 142. The seat 132 restricts a further insertion of the inserted stop 130. Then, the engagement part 132 restores to the original shape. The stop 130 in this state may fix the bridge part 140 as discussed above.

The rivet 122 is inserted into the stop 130. The rivet 122 faces the rivet convex part 129 at the front and is inserted into the shaft hole 133 in the stop 130 from the side of the seat 131. As discussed, the shaft hole 126 has a convex part (not shown) at its tip of the engagement part 132. Therefore, a mere attempt of insertion of the rivet 122 would not enable the convex part (not shown) of the rivet 122 to be inserted farther. Therefore, a user should force the rivet 122 to be inserted into the stop 130 so that the rivet 122 expands the engagement part 132. In this state, the convex part (not shown) of the rivet 122 is subject to a radial expansion force due to the compression of the rivet 122. Thereby, the extendable and shrinkable engagement part 132 is expanded to a size into which the rivet 122 may be inserted, and accepts the rivet 122.

The second washer 127 restricts a further insertion of the rivet 122, and the stop 130 is located at the midsection of the rivet 122. In this state, the rivet convex part 129 projects from the stop 130. The midsection of the rivet 122 is smaller in diameter than the rivet convex part 129, and the engagement part 132 restores to the original shape. Therefore, the rivet 122 is not easily released from the stop 130. The above procedure integrates the rivet 122 with the stop 130. This connection is not absolute, and is set to prevent clamping between the retention part 110 and the expansion card 10 from easily releasing. Therefore, when the user applies a predetermined pulling force, the rivet 122 is released from the stop 130.

The retention part 110 is finally attached to the rivet 120 through the connection hole 118. Since the inventive retention unit 100 does not require a specific tool for attachment, the attachment becomes easier than the conventional clamping mechanism 500.

A description will now be given of the clamping of the expansion card 10. After the above attachment, the retention part 110 moves to a position near the edge 12 of the expansion card 10. The fixing grooves 144 in the bridge 140 maintain an intersection angle between the retention part 110 and the bridge part 140 when the retention part 110 moves. Referring to FIGS. 2 and 4, the retention part 110 may move right or left in the circumferential direction relative to the bridge part 140. For example, after the retention part 110 moves in an either direction, it is found that no compression force is applicable because of a connector etc. at the connection position between the card fixing part 114 and expansion card 10. In this case, the retention part 110 moves in an opposite direction and the opposite card fixing part 114 fixes the expansion card 10. This is true to a shorter expansion card 10c shown in FIG. 11. Except these expansion cards 10, a user freely select a rotary direction of the retention part 110.

Figure 11:
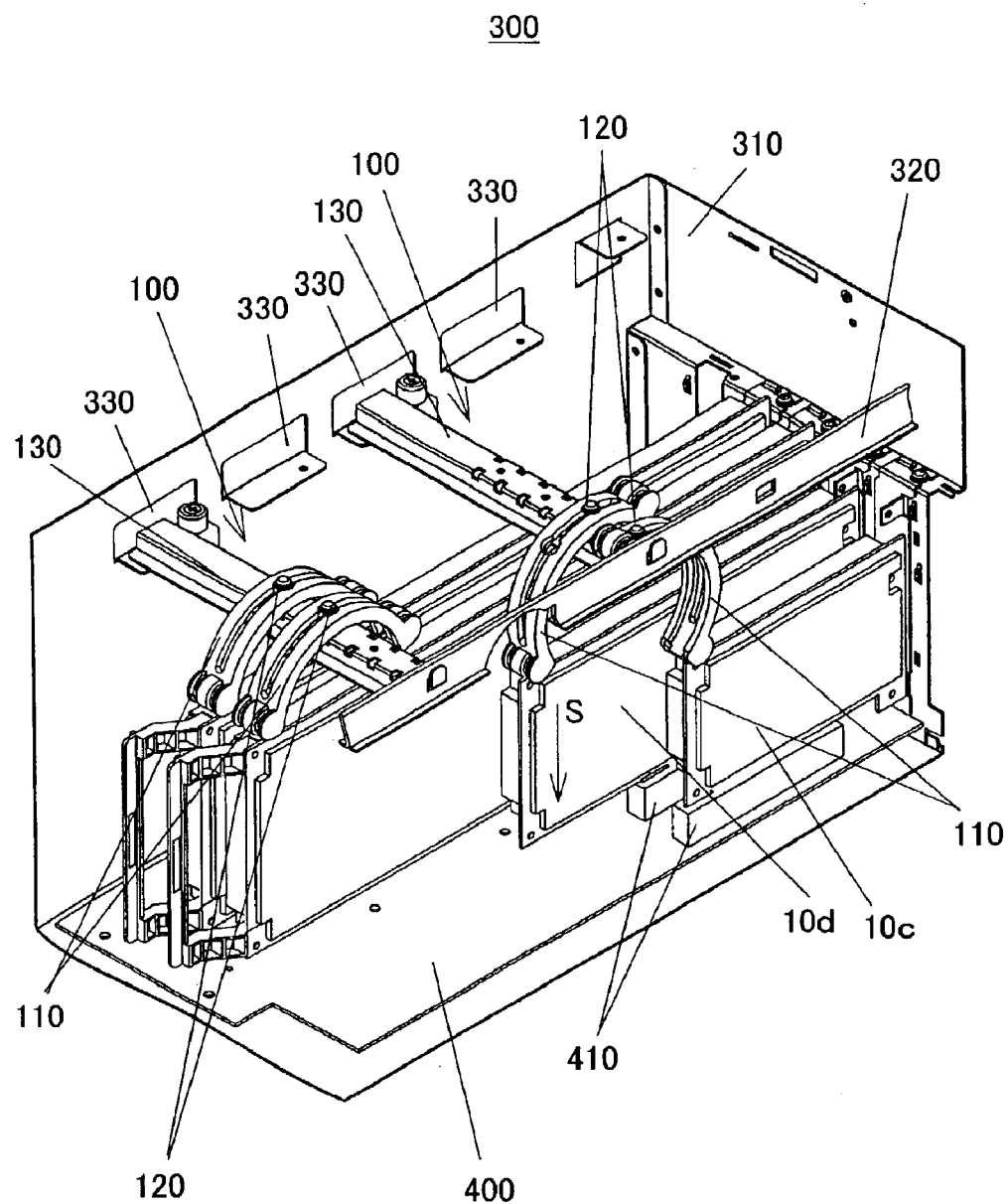
FIG. 11 is an enlarged perspective view of the PC shown in FIG. 10 near the retention unit.

Referring now to FIGS. 3 and 4, the retention part 110 is held by the rivet part 120 and its movement in the direction Z is restricted. Therefore, a locus of the movement of the retention part 110 draws an arc that extends the arc of the retention part 110 with the rivet part 120 as a vertex. In this state, the card support part 114 moves up and down. Referring to FIG. 11, it is understood that the low and high expansion card 10c and 10d may be clamped by moving the retention part 110 in the circumferential direction.

Then, the retention part 110 contacts the expansion card 10. A user slightly picks up the retention part 110 with fingers, and slightly deforms the arm part 112. This action forces the retention part 110 in the radial expansion direction of the arc. Therefore, the elasticity of the arm part 112 results in a reactive force to push back the retention part 110 in the radial shrinking direction. When the retention part 110 rotates and fingers are released in this state, the retention part 110 necessarily applies a force in the compression direction of the expansion card 10. Use of this force or a function of flat spring of the arm part 112 would enable the retention part 110 to compress the expansion card 10 in the insertion direction S and consequently clamp the expansion card 10. Therefore, the expansion card 10 always applies a force in the insertion direction S, preventing the card from pulling off. The fixing grooves 144 always maintain an intersection angle between the retention part 110 and the bridge part 140 even in the clamping action. Therefore, the expansion card 10 does not apply a force in a direction bending the expansion card 10 from the expansion slot 410.

As discussed, the inventive retention unit 100 may fix the expansion card 10 at two points, and the clamping position may be arbitrarily selected. Therefore, it is not necessary to change a fixing position of the retention part 110 for each bridge part 140, unlike the conventional structure. Even when the card fixing part 114 varies its position depending upon the height of the expansion card 10, the uppermost position of the retention part 110 does not exceed the rivet part 120. Therefore, the PC 300 does not create dead space unlike the conventional clamping mechanism that projects the compression member (corresponding to the retention part 110) in the direction opposite to the expansion card 10. Therefore, PC 300 may easily have a small housing.

In detachment, the bridge part 140 is removed from the PC 300 to unfix the expansion card 10, and allow the retention unit 100 to be removed from the expansion card 10. In an attempt to unfix a specific expansion card 10, the retention part 110 rotates in the direction opposite to the compression direction, or the cylindrical part 118 in the slit 116 moves to the rivet part 120 and the retention part 110 is detached for unfixing.

When the PC 300 is mounted with the expansion card 10, and a corresponding device is connected to the expansion card 10, a user may operate the device as if the device function has been preinstalled in the PC 300. In this way, the user may enhance the expansion feature.

Figure 12:
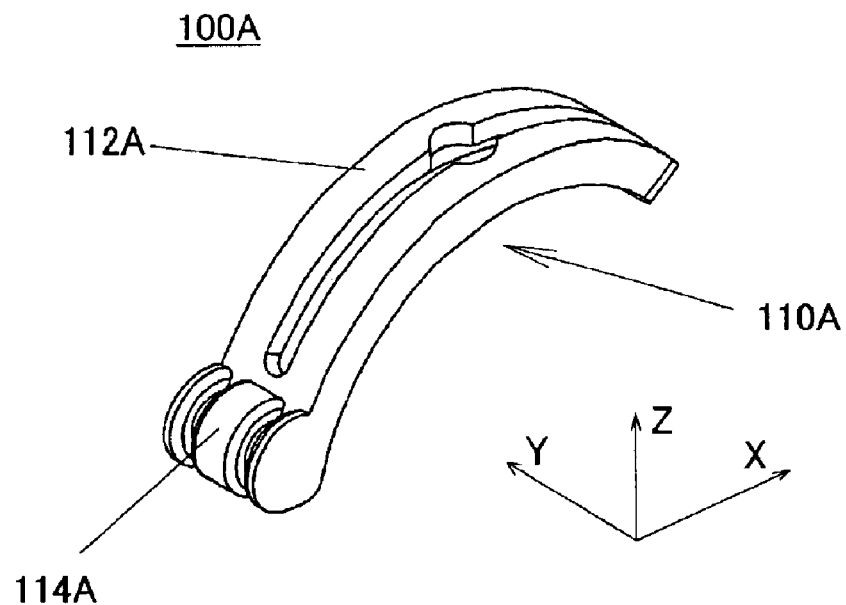
FIG. 12 is a perspective view of a retention part in a retention unit as a variation of that shown in FIG. 1.
Figure 13:
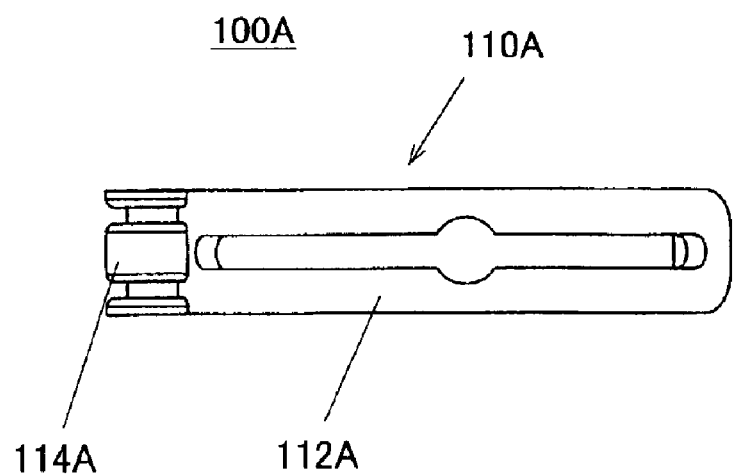
FIG. 13 is a top view of the retention part shown in FIG. 12.
Figure 14:
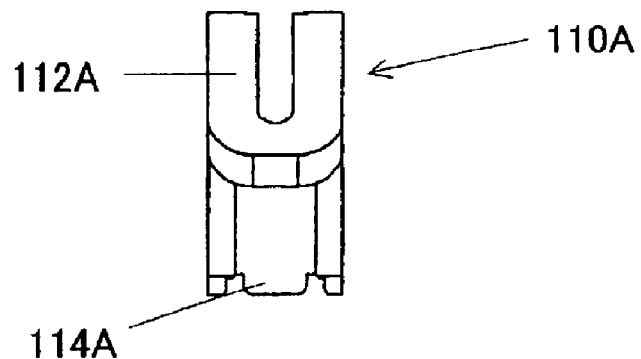
FIG. 14 is a longitudinal side view of the retention part shown in FIG. 12.
Figure 15:
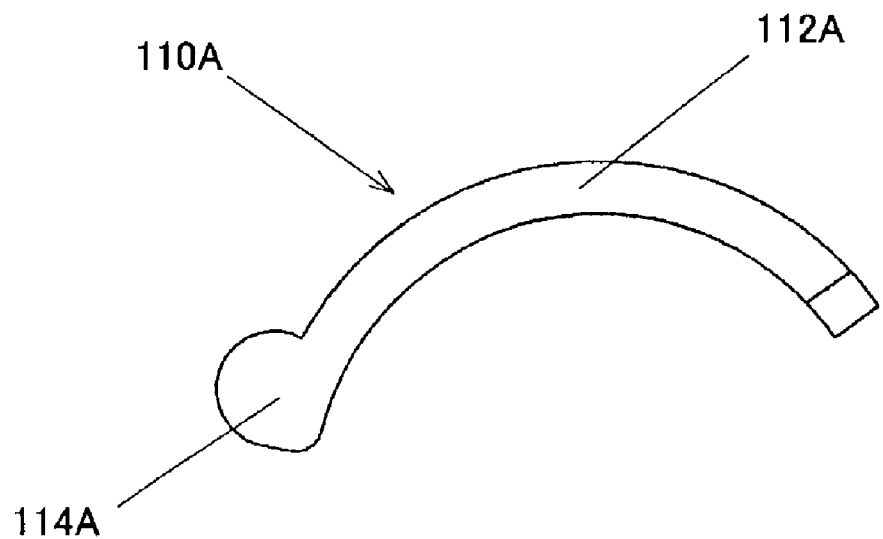
FIG. 15 is a lateral side view of the retention part shown in FIG. 12.

Referring now to FIGS. 12 to 15, a description will be given of a retention unit 100A as a variation of the inventive retention unit 100. FIG. 12 is a perspective view of a retention part 110A in the retention unit 100A as a variation of the retention unit 100 shown in FIG. 1. FIG. 13 is a top view of the retention part 110A shown in FIG. 12. FIG. 14 is a longitudinal side view of the retention part 100A shown in FIG. 12. FIG. 15 is a lateral side view of the retention part 100A shown in FIG. 12.

The retention unit 100A corresponds to the above retention unit 100 in which the retention part 110 is replaced with the retention part 110A shown in FIG. 12. The retention part 110A includes a card fixing part 114A at one of tips of the arm part 112A. The retention part 110A is formed laterally symmetrically in the direction X (see FIG. 14). Other than that, it is the same as the retention part 110, and a detailed description of common points will be omitted.

The above retention unit 100 may clamp the expansion card 10 at two points depending upon the rotating directions of the retention part 110. On the other hand, the instant variation uses only one card fixing part 114A, and thus it is difficult to fix the expansion card 10 at two points by rotating the retention part 110A as in the above embodiment. However, in fixing the expansion card 10, the two-point fixation is available by rotating the retention part 110A by 180 degrees viewed from the direction shown in FIG. 13. It is more important that the retention part 110A in the retention unit 100A is made symmetrical than the retention part 110. It is understood that a rotation of the retention part 110A by 180 degrees provides the retention part 110A with functions similar to those of the retention part 110.

Figure 16:
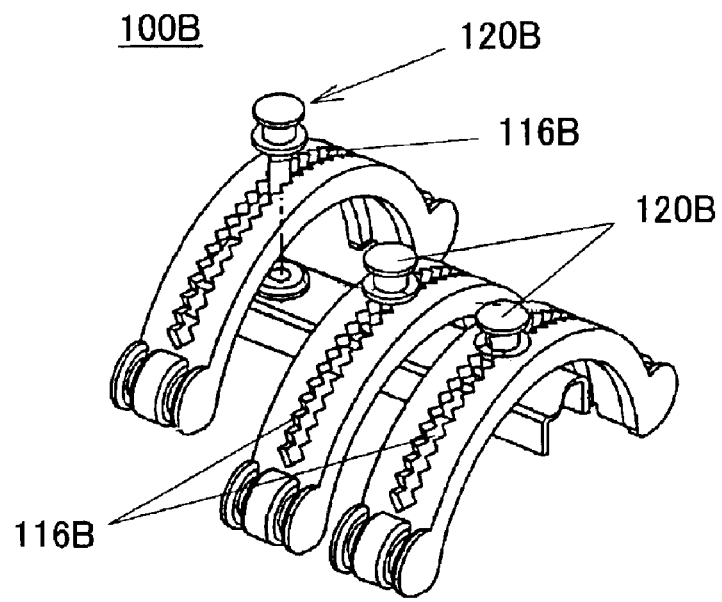
FIG. 16 is a perspective view of a retention part in a retention unit as a variation of that shown in FIG. 1.

Referring now to FIGS. 16 and 17, a description will be given of a retention unit 100B as a variation of the inventive retention unit 100. FIG. 16 is a perspective view of the retention unit 100B as a variation of the retention unit 100 shown in FIG. 1. FIG. 17 is side and sectional views of a rivet part 120B of the retention unit 100B shown in FIG. 16.

The retention unit 100B has a retention part 110B with a saw-tooth shaped slit 116B. This saw-tooth shaped slit 116B has a width engageable with the midsection 126B of the rivet 122B. The instant variation forms the midsection 126B of the rivet 122B as a square rod engageable with the slit 116. The second washer 127 of the rivet 120 is substituted by the above square rod, and thus the midsection 126B in this variation is formed larger than the above midsection 122b in the retention part 100. Other portions are similar to those in the retention unit 100, and thus a detailed description thereof will be omitted.

The retention unit 100B of this structure provides a more definite engagement between the retention part 110B and the rivet part 120B. Alternatively, the slit 116B is slightly wider than the midsection 126B of the rivet 122B, and a user applies a circumferential force to move the retention part 110B stepwise along the saw teeth in the circumferential direction. Advantageously, this structure may maintain a clamping force between the rivet part 120B and the retention part 110B to some extent, and realize the movement. The present invention does not limit a shape engageable with the slit 116B of the rivet 122B to the above square rod. For example, it may be a cylinder or polygon that inscribes one saw tooth in the slit 116B.

Figure 18:
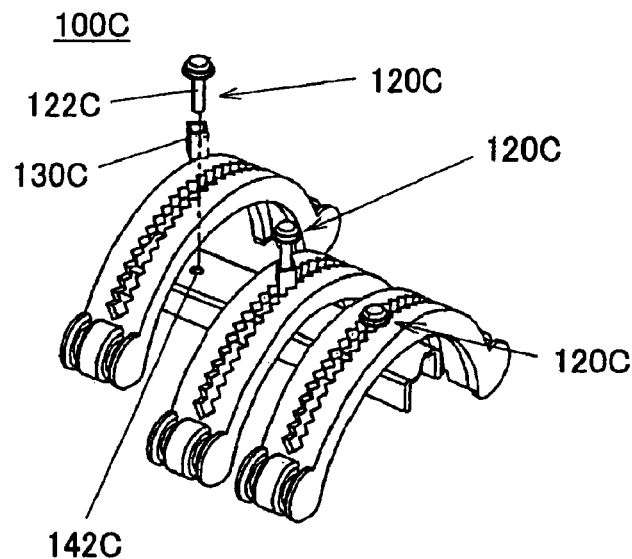
FIG. 18 is a perspective view of a retention unit as a variation of that shown in FIG. 16.
Figure 19:
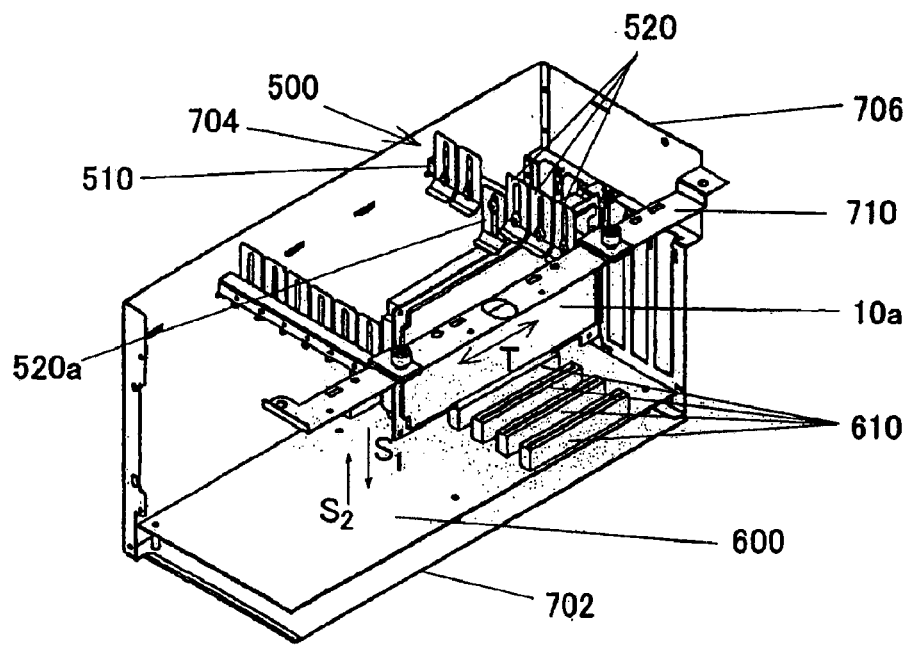
FIG. 19 is an enlarged perspective view of a conventional PC near its clamping mechanism.
Figure 20:
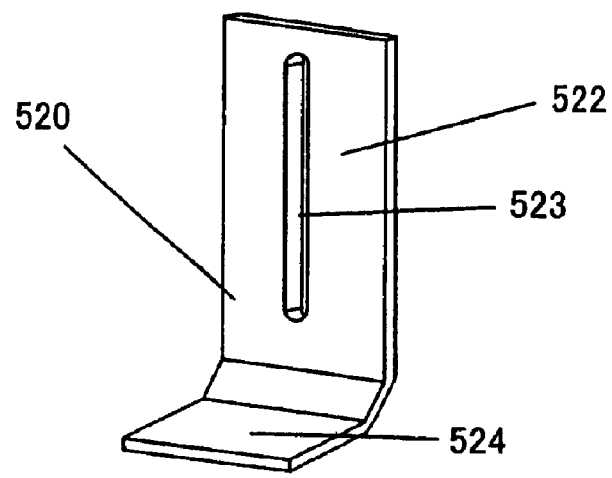
FIG. 20 is an enlarged perspective view of a fixing member used for the clamping mechanism shown in FIG. 19.
Figure 21:
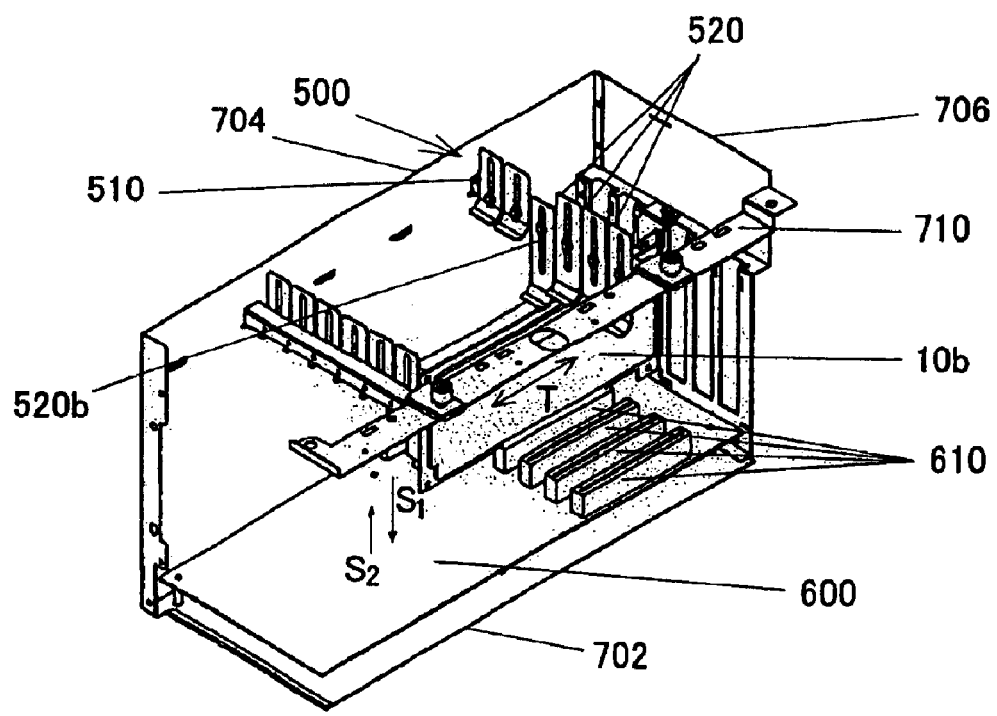
FIG. 21 is an enlarged perspective view of the conventional PC near its clamping mechanism.

Referring to FIG. 18, the rivet part 120B may be replaced with the rivet part 120C. FIG. 18 is a perspective view of a rivet part 120C as a variation of the rivet part 120B shown in FIG. 16. The rivet part 120C includes a rivet 122C and a stop 130C. The rivet 122C is a screw having a predetermined shape pursuant to the JIS standard, and the screw portion is longer than the stop 130C, which will be described later. The stop 130C has a square nut at outer circumference, and a screw groove suitable for the rivet 122C. The stop 103C has approximately the same shape as the rivet midsection 126B of this rivet 122C and is made a slightly longer.

Along with the deformation of the rivet part 120C, the attachment hole 142B in the bridge part 140B is replaced with the attachment hole 142C. The attachment hole 142C forms a screw groove having a diameter corresponding to the screw of the rivet 122C. Other portions are similar to those of the retention unit 100B, and a detailed description thereof will be omitted.

This structure enables the rivet 122C of the rivet part 120C to be screwed into the attachment hole 142C through the stop 130C. Therefore, an engagement between the rivet part 120C and the attachment part 142C may be made firmer. The rivet part 120C is a variation of the rivet 120B, and other portions have similar effects to those of the retention unit 100B.

For the retention units 100A to 100C in the above variations, a description of common portions to the retention unit 100 will be omitted. It is easily understood the above variations have similar effects of the retention unit 100.

Figure 26:
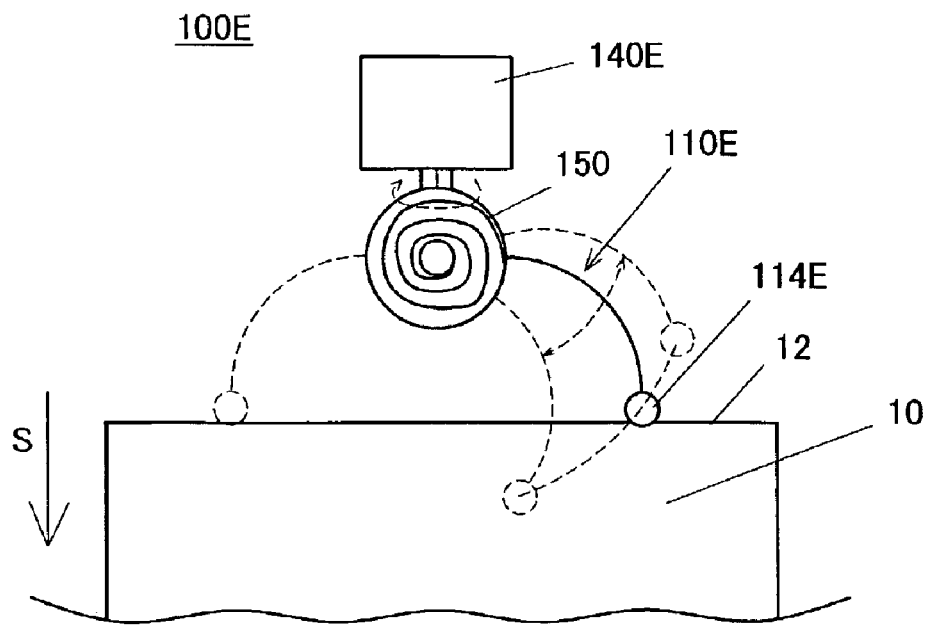
FIG. 26 is a schematic side view of a retention unit as another aspect according to the present invention.
Figure 27:
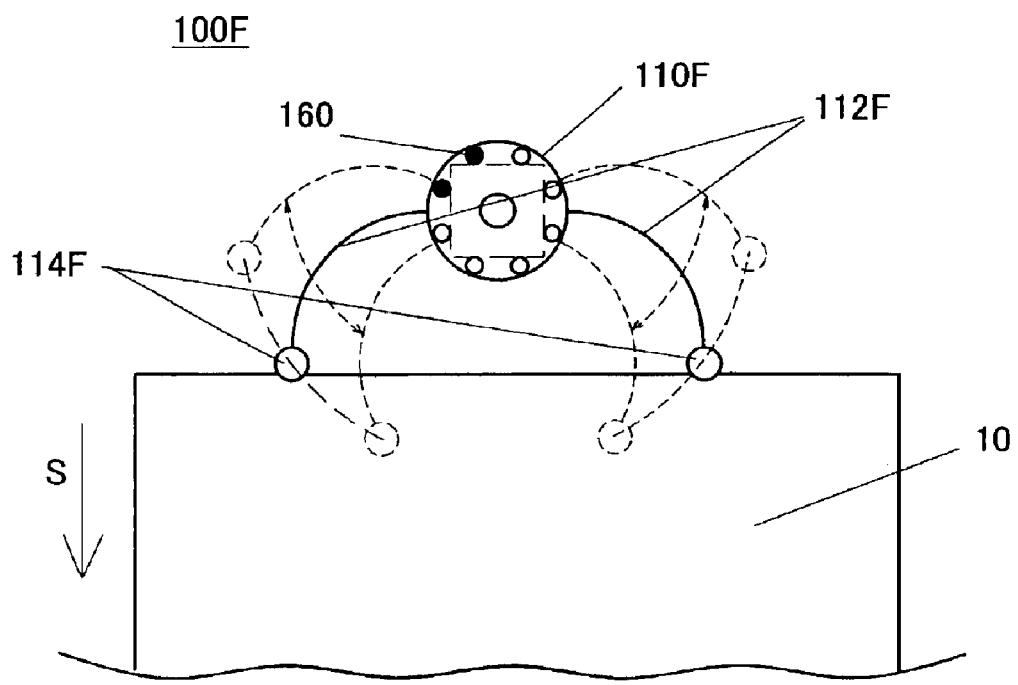
FIG. 27 is a schematic side view of a retention unit as another aspect according to the present invention.

Referring now to FIGS. 26 to 28, a description will be given of retention units 100E to 100G of other embodiments according to the present invention. FIGS. 26–28 are schematic side and perspective views of retention units 100E to 100G as other aspects according to the present invention.

A description will now be given of the retention unit 100E of the other embodiment with reference to FIG. 26. The retention unit 100E has forcing means, such as a spring 150, and this spring always applies a force to the retention part 110E in the insertion direction S of the expansion card 10. The retention part 110E is not limited to an arc shape, but may have a linear shape. When viewed from the top in FIG. 26, the retention part 110E is orthogonal to the bridge part 140E, and rotatable by 180 degrees. In fixing the expansion card 10 with the retention unit 100E, a user lifts the retention part 110E in a direction opposite to the insertion direction S of the expansion card 10 against the spring force, and brings the card support part 114E of the retention part 110E into contact with the edge 12 of the inserted expansion card 10. As discussed, the spring 150 always applies a force in the insertion direction S of the expansion card 10, and thus the above retention part 110E may necessarily clamp the expansion card 10. As shown by a dotted line, a locus of the retention part 110E does not project in the direction opposite to the insertion direction S beyond the bridge part 140E irrespective of whether a high or low expansion card 10 is supported. A rotation of the retention part 110E by 180 degrees may provide two-point clamping of the expansion card 10.

A description will be given of the retention unit 100F of the other embodiment with reference to FIG. 27. The retention unit 100F includes a pair of arm parts 112F and is made rotatable to the bridge part 140F. The rotatable retention part 110F uses the pin or projection 160 to stop rotations. A pair of arm parts 112F are orthogonal to and symmetrical to the bridge part 140F. The retention part 100F is rotatable as shown in a dotted line as illustrated. The retention unit 100F rotates the retention part 110F to such a position that the retention part 110F may contacts the edge 12 of the expansion card 10, and presses the expansion card 10 by using the pin 160 etc. to stop rotations. A position of the card, fixing part 114F may change when a rotation of the retention part 110F changes, and expansion cards of various heights may be easily supported. An arc-shaped arm part 112F would restrain the unpressing arm part 112F from projecting in a direction opposite to the insertion direction S.

A description will be given of the retention unit 100G of the other embodiment with reference to FIG. 28. The retention unit 100G includes a bridge part 140G having an approximately triangular-shaped section, and a retention part 110G that is slidable on a slope 146 of the bridge part 140G. The retention part 110G is fixed onto the bridge part 140G by a screw 170 or a rivet through the slit 116G. The retention part 140G slides on the slope of the bridge part 140G, and contacts the edge 12 of the expansion card 10. The retention part 110G is fixed onto the bridge part 140G via the screw 170, etc. in this state to clamp the expansion card 10. Since the retention part 110G is attached to the slope 146 of the bridge part 140G, the height of the projection in the direction opposite to the insertion direction S is lower than the conventional retention unit even for sliding. Although FIG. 28 provides one of the slopes 146 with the retention part 110G, the retention part 110G may be provided at both slopes 146. Thereby, the retention part 110G may clamp the expansion card 10 at two points.

Further, the present invention is not limited to these preferred embodiments, and various modifications and changes may be made in the present invention without departing from the spirit and scope thereof. For example, a card-shaped electronic component is not limited to an expansion card to be inserted into a slot on the motherboard, but may simply be a card-shaped board.

The inventive retention unit draws an arc movement locus that extends the arc of the retention part 110 with the rivet part 120 as a vertex even when the card clamping part moves up and down according to heights of the expansion cards. Therefore, the uppermost position of the retention part is never beyond the rivet part. Therefore, the PC housing may be made smaller than the conventional clamping mechanism that projects the card clamping part moves in the direction opposite to the card. The inventive retention unit may clamp the expansion card at two points. Therefore, even when one clamping position cannot press the expansion card, the retention unit needs not be moved entirely as in the conventional clamping mechanism, but the retention part may simply rotate to press the expansion card.

What is claimed is:

1. A clamping mechanism comprising:
    a retention part that fixes a card-shaped electronic component that has been inserted into a slot in a predetermined direction for electric connection; and
    a support part that supports said retention part in a direction that intersects with the predetermined direction;
        wherein said retention part includes a slit for making a connection with said support part, which slit extends in a direction that intersects with said support part.

2. A clamping mechanism according to claim 1, wherein said retention part is adapted to be rotatable around said support part by 180 degrees viewed from the predetermined direction, and to be supportable by said support part, and
    wherein said retention part includes a pair of grooves engageable with the card-shaped electronic component, each groove being engageable with the electronic component before and after a rotation of 180 degrees.

3. A clamping mechanism according to claim 1, wherein said retention part has an approximately U-shaped section, and includes a pair of clamping parts at both ends thereof that fix the card-shaped electronic component.

4. A clamping mechanism according to claim 1, wherein said retention part includes an approximately arc-shaped section.

5. A clamping mechanism according to claim 1, wherein said retention part includes a first connection hole and a second connection hole connected to the first connection hole,
    wherein said clamping mechanism further comprises a connector part that connects said retention part to said support part, said connector part being dimensioned such that said connector part may be detachably attached to the first connection hole and fixes said retention part onto said support part through the second connection hole.

6. A clamping mechanism according to claim 5, wherein said connector part is a nylon rivet.

7. A clamping mechanism according to claim 6, wherein the nylon rivet has a polygonal sectional shape.

8. A clamping mechanism according to claim 5, wherein said connector part is an insulator.

9. A clamping mechanism according to claim 5, wherein said connector part is polygonal spacing bolts.

10. A clamping mechanism according to claim 1, wherein the slit has a saw-tooth shape.

11. A clamping mechanism comprising:
    an approximately U-shaped retention part that fixes a card-shaped electronic component that has been inserted into a slot for electric connection; and
    a support part that supports said retention part,
    wherein said clamping mechanism may move the retention part alone the approximately U-shape on the support part as a vertex.

12. An electronic apparatus comprising:
    a card-shaped electronic component;
    a board that arranges at least a slot, said electronic component being connectible electrically to the board when inserted into the slot in a predetermined direction; and
    a clamping mechanism for clamping the electronic component that has been inserted into the slot,
    wherein said clamping mechanism includes:
    a retention part that fixes said card-shaped electronic component inserted into the slot in a predetermined direction for electric connection; and
    a support part that supports said retention part in a direction that intersects with the predetermined direction,
    wherein said retention part includes a slit for making a connection with said support part, which slit extends in a direction that intersects with said support part.

13. An electronic apparatus comprising:
    a card-shaped electronic component;
    a board that arranges at least a slot, said electronic component being connectible electrically to the board when inserted into the slot; and
    a clamping mechanism for clamping the electronic component that has been inserted into the slot,
    wherein said clamping mechanism includes:
    an approximately U-shaped retention part that fixes said card-shaped electronic component in the slot; and
    a support part that supports said retention part,
    wherein said clamping mechanism may move the retention part along the approximately U-shape on the support part as a vertex.

14. A clamping mechanism comprising:
    a retention part that fixes a card-shaped electronic component that has been inserted into a slot in a predetermined direction for electric connection; and
    a support part that supports said retention part in a direction that intersects with the predetermined direction,
    wherein said clamping mechanism includes a first connection hole and a second connection hole connected to the first connection hole,
    wherein said fixing member further comprises a connector part that connects said retention part to said support part, said connector part being dimensioned such that said connector part may be detachably attached to the first connection hole and fixes said retention part onto said support part through the second connection hole.

* * * * *